United States Patent [19]

Hunsinger

[11] 4,370,569
[45] Jan. 25, 1983

[54] INTEGRATABLE SINGLE PULSE CIRCUIT

[75] Inventor: Dan M. Hunsinger, Santa Clara, Calif.

[73] Assignee: Hewlett-Packard Company, Palo Alto, Calif.

[21] Appl. No.: 202,279

[22] Filed: Oct. 30, 1980

[51] Int. Cl.³ .................... H03K 5/06; H03K 5/153
[52] U.S. Cl. ............................... 307/266; 307/517; 307/602; 307/601; 307/309
[58] Field of Search ............... 307/265, 266, 602, 514, 307/517, 309; 328/55

[56] References Cited

U.S. PATENT DOCUMENTS

| | | | |
|---|---|---|---|
| 2,933,625 | 4/1960 | Townsend et al. | 307/602 |
| 3,107,306 | 10/1963 | Dobbie | 307/514 |
| 3,231,765 | 1/1966 | Martin et al. | 307/266 |
| 3,979,746 | 9/1976 | Jarrett | 307/517 |
| 4,081,698 | 3/1978 | Minakuchi | 307/266 |

FOREIGN PATENT DOCUMENTS 1475199 11/1974 United Kingdom.
2040628 11/1979 United Kingdom.

OTHER PUBLICATIONS

Article from Texas Instruments', *Semiconductor Circuit Design*, vol. II, (1973), p. 17 (text) and FIG. 38.
Article from Texas Instruments', *System 74 Designer's Manual*, (1973), p. 82 (text) and FIG. 2.

*Primary Examiner*—John S. Heyman
*Attorney, Agent, or Firm*—Jeffery B. Fromm; Edward Y. Wong

[57] ABSTRACT

An integratable circuit provides a single short pulse in response to a trigger input to the circuit. The circuit relies entirely on internal elements without the use of regeneration for determining the pulse width. Specifically, two signal paths from the input meet at the output to generate the short pulse.

1 Claim, 4 Drawing Figures

INTEGRATABLE SINGLE PULSE CIRCUIT

BACKGROUND AND SUMMARY OF THE INVENTION

Short pulses with well-controlled widths find wide spread applications in the electronic industry. For instance, it is used in clocking circuits, in triggering circuits, and the like. Because of its importance, many integrated circuits (IC's) have been designed to generate them. Short pulses generated by IC's in the prior art are typically generated using external capacitors. This method has the disadvantage of complexity and added costs. For IC's to generate short pulses without using capacitors, the IC's typically digitally generate them with combination gates, usually in regenerative loops. This method, however, has the disadvantage of requiring large IC areas to implement the pulse circuit. This is a distinct disadvantage in high frequency applications, because large IC areas tend to have more stray capacitance to degrade high frequency propagations.

A circuit in accordance with the preferred embodiment of the present invention generates short pulses without the disadvantages of these two prior art methods. The short pulse generated by the circuit in accordance with the present invention is short compared to the period of the operating frequency; therefore it can be used in such circuits as phase-lock loops and sample-and-hold circuits. The circuit utilizes propagation delay through the circuit elements to determine the width of the pulse. In this manner, the circuit does not need to rely on external timing capacitors or a regenerative gating scheme to generate a pulse. The pulse thus generated is simple and is ideal for use in high frequency circuits.

DETAILED DESCRIPTION OF THE INVENTION

Figure 1:
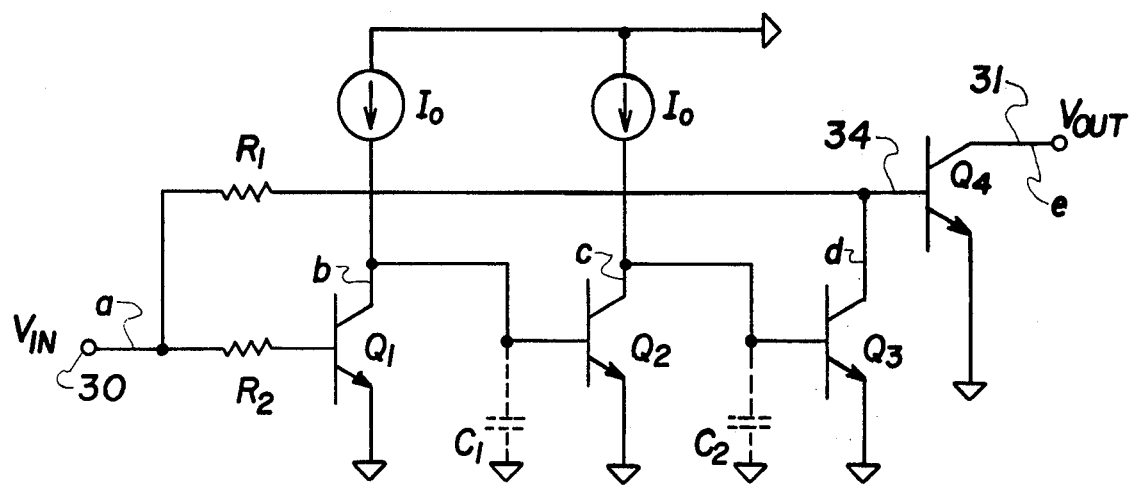
FIG. 1 shows the preferred embodiment of the pulse circuit in accordance with the invention.
Figure 2:
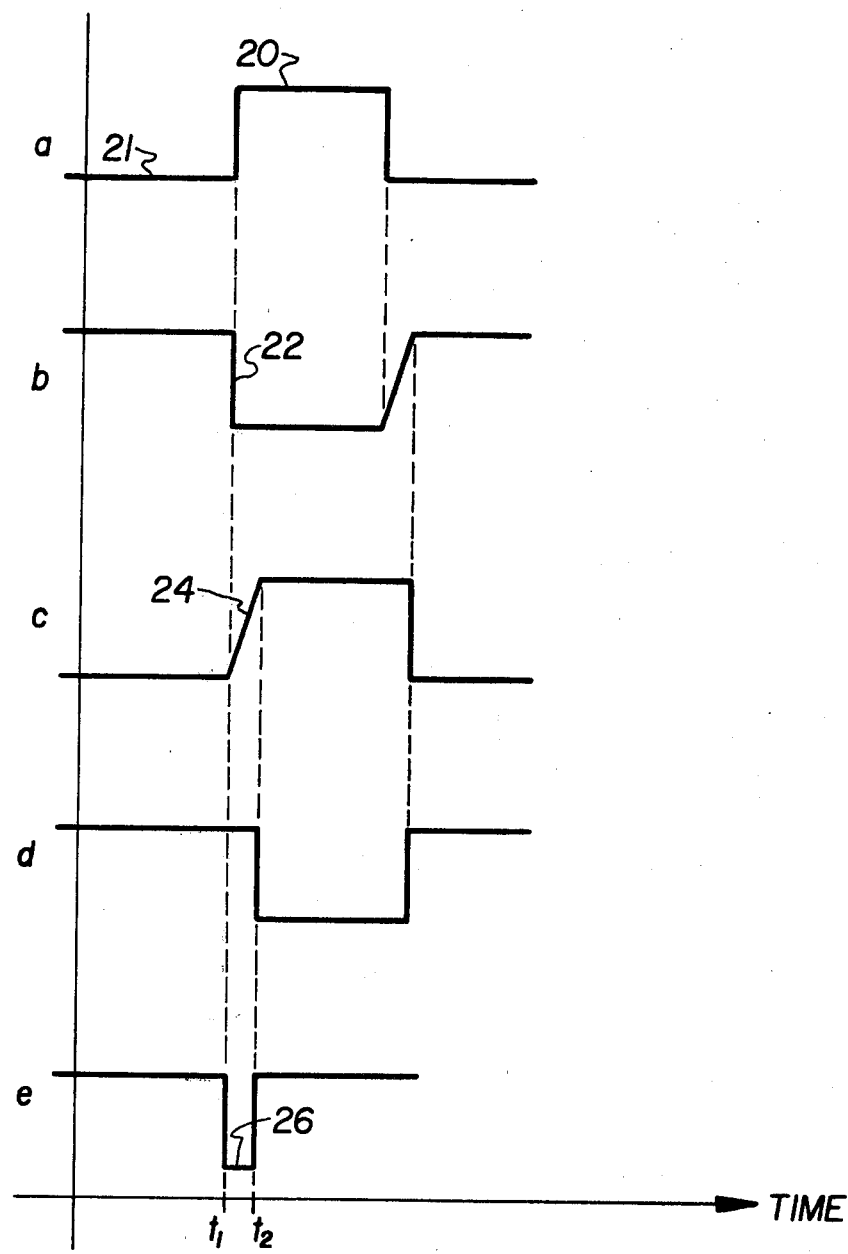
FIG. 2 shows the waveforms at various points a through e in the circuit of FIG. 1.

FIG. 1 shows a pulse circuit in accordance with the preferred embodiment of the invention. Initially the input 21 at input node 30 is low, and the output port 31 is open. The states of the intermediate transistors at this point are shown in FIG. 2. If a high input signal 20 is applied to the circuit at input node 30 at time $t_1$, Q1 is immediately turned on, thus discharging the nodal capacitance $C_1$. With this immediate discharge 22 of $C_1$, Q2 is also immediately turned off. The collector of Q2, which is coupled to nodal capacitance $C_2$ at the base of Q3, starts to charge high 24 at point $t_1$ to some point sufficiently high to turn Q3 on. This point in time is designated $t_2$. Prior to $t_2$, with Q3 off and a high input 20 applied at input node 30, the output port is turned on. However, at point $t_2$, with Q3 turning on and thus shorting the base 34 of Q4 to ground, Q4 is turned off; it thus returns to its initial state of open collector. During the period 26 between $t_1$ and $t_2$, it should be noted, Q4 is via resistor R1 connected to input node 30 to generate a pulse of very short duration, that is, only from $t_1$ to $t_2$. This can be clearly seen from the relative waveforms shown in FIG. 2. This short pulse 26 constitutes the pulse output of the circuit.

A mathematical analysis of the operation of the circuit as described above follows. If $C_1$ and $C_2$ are the nodal capacitance associated at the collector nodes of Q1 and Q2, respectively, and are made equal to C, for example, by carefully laying out the integrated circuit elements in the topology of the IC, the base-emitter voltage $V_{BE}$ of Q2 and Q3 are as follows:

$$V_B = (1/C) \int_0^{\Delta t} I_o dt \qquad (1)$$

$$= I \Delta t/C.$$

More completely, considering the initial voltage of the drive transistor, $V_{CEsat}$:

$$V_{BEON} = (1/C) \int_0^{t_{ON}} I_o dt + V_{CEsat}, \qquad (2)$$

or;

$$V_{BEON} - V_{CEsat} = I_o t_{ON}/C. \qquad (3)$$

Thus, the duration of the pulse from $t_1$ to $t_2$ is given by:

$$t_{ON} = (V_{BEON} - V_{CEsat})C/I_o. \qquad (4)$$

Hence, the duration of the pulse is directly proportional to the nodal capacitance C.

The pulse circuit in accordance with the preferred embodiment can be made relatively independent of temperature. In other words, the pulse width can be made constant and independent of temperature. If one realizes that $V_{CEsat}$, being the difference of two diode voltages, is relatively insensitive to temperature, and if C is made independent of temperature T, the temperature dependence of the pulse width is as follows if $V_{CEsat}$ is ignored because $V_{BEON} >> V_{CEsat}$:

$$\partial t_{ON}/\partial T = C[I_o \partial V_{BEON}/\partial T - V_{BEON} \partial I_o/\partial T]/I_o^2. \qquad (5)$$

For zero temperature effect, equation (5) is made equal to zero, or $$(1/V_{BEON})\partial V_{BEON}/\partial T = (1/I_o)(\partial I_o/\partial T). \qquad (6)$$

If $I_o$ is made equal to $V_{BE}/R$, and R is made independent of temperature, then $$\partial t_{ON}/\partial T = C[(V_{BE})(\partial V_{BEON}/\partial T) - \qquad (7)$$

$$(V_{BEON})(\partial V_{BE}/\partial T)]/(V_{BE}^2/R)$$

$$= (RC/V_{BE})[\partial V_{BEON}/\partial T] - (V_{BEON}/V_{BE})(\partial V_{BE}/\partial T)].$$

Thus, $\partial t_{ON}/\partial T$ can be made vanishingly small by making $V_{BE}$ approach $V_{BEON}$.

Figure 3:
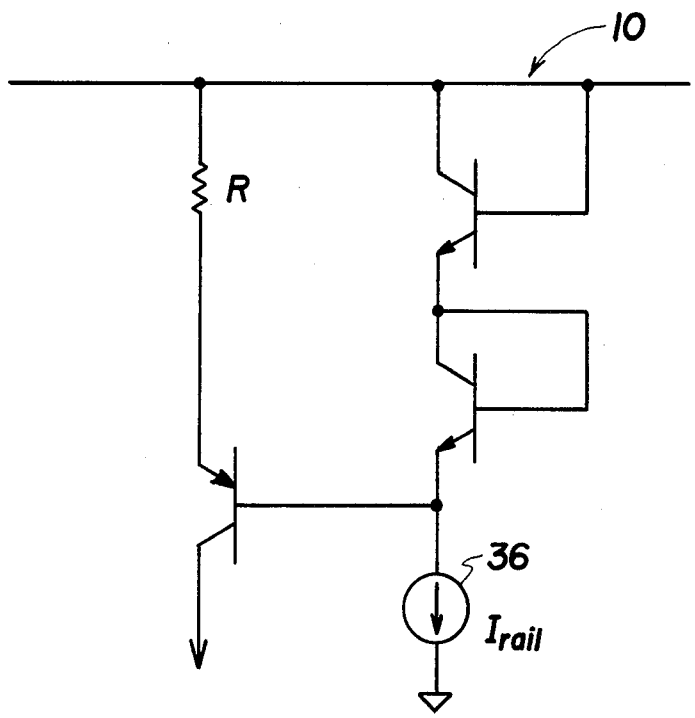
FIG. 3 shows an implementation of a current source.
Figure 4:
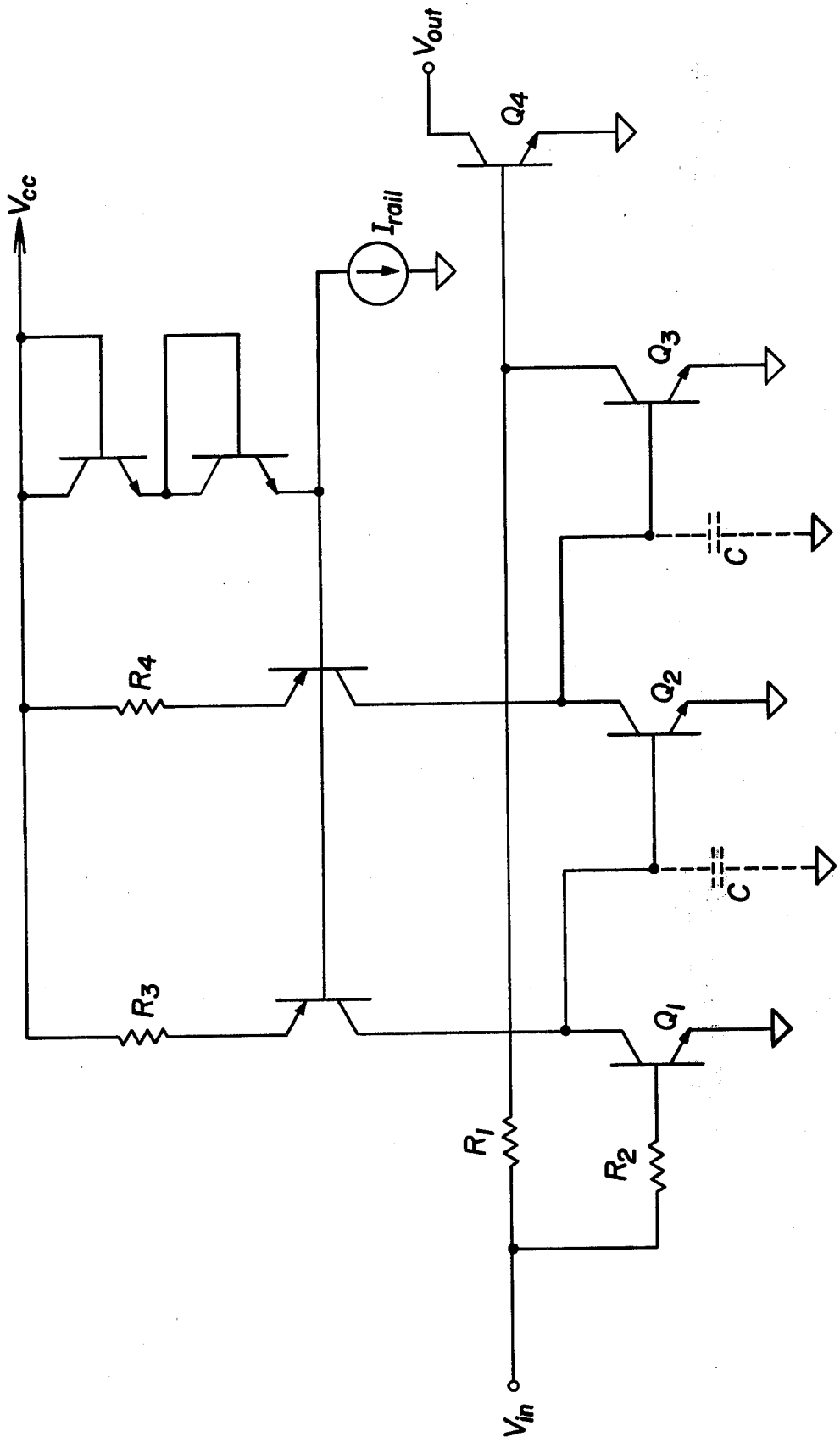
FIG. 4 shows the incorporation of the current source of FIG. 3 into the pulse circuit of FIG. 1 for a temperature independent pulse circuit.

To implement a current source $I_o$ such that $I_o = V_{BE}/R$, the circuit in FIG. 3 is used. This current source 10 is easily implemented in integrated circuits. The rail current source 36 is usually a standard element in integrated circuits. With the incorporation of this circuit 10 into the pulse circuit of FIG. 1, an integratable circuit in accordance with the preferred embodiment of the invention as shown in FIG. 4 results.

I claim:

1. A circuit for generating a single pulse in response to an applied trigger having a width greater than the generated single pulse comprising:

an input port for receiving an applied input trigger;

an output port coupled to said input port for providing a single pulse having a select width in response to said input trigger, said output port comprising a first transistor having its base coupled to said input port and its collector uncoupled for connection to an external connection;

timing means coupled to said input port for delaying said input trigger by a select time t, said timing means comprising (a) a second and a third transistor, said second transistor having its base coupled to said input port and its collector coupled to a first temperature compensated capacitor and to the base of said third transistor, and said third transistor having a collector coupled to a second temperature compensated capacitor and to said shunt means, and (b) two temperature compensated current sources having a fifth transistor having its collector coupled to said second transistor collector and its emitter coupled to a first resistor, a sixth transistor having its collector coupled to said third transistor collector and its emitter coupled to a second resistor, a first diode means coupled to an input of a second diode means, and a rail current source coupled to the output of said second diode means and to the base of said fifth transistor and to the base of said sixth transistor, thereby said timing means is independent of temperature; and shunt means coupled to said output port for truncating said input trigger in response to said input trigger delayed by t applied thereto to provide said single pulse, said shunt means comprising a fourth transistor having its base coupled to the collector of said third transistor and its collector coupled to the base of said first transistor.

* * * * *

UNITED STATES PATENT AND TRADEMARK OFFICE
CERTIFICATE OF CORRECTION

PATENT NO. : 4,370,569

DATED : January 25, 1983

INVENTOR(S) : Dan M. Hunsinger

It is certified that error appears in the above—identified patent and that said Letters Patent is hereby corrected as shown below:

In column 1, line 67, after "is" insert -- switched on ";

In column 2, lines 63 and 64, the hyphenated equation should not be hyphenated and should read -- $I_o = V_{BE}/R$ --.

Signed and Sealed this

Twenty-ninth Day of March 1983

[SEAL]

Attest:

GERALD J. MOSSINGHOFF

Attesting Officer

Commissioner of Patents and Trademarks